United States Patent
Ino et al.

(10) Patent No.: US 9,634,248 B2
(45) Date of Patent: Apr. 25, 2017

(54) INSULATOR AND MEMORY DEVICE

(71) Applicant: Kabushiki Kaisha Toshiba, Minato-ku (JP)

(72) Inventors: Tsunehiro Ino, Fujisawa (JP); Yasushi Nakasaki, Yokohama (JP); Shosuke Fujii, Kuwana (JP); Daisuke Matsushita, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/061,552

(22) Filed: Mar. 4, 2016

(65) Prior Publication Data

US 2017/0069841 A1    Mar. 9, 2017

(30) Foreign Application Priority Data

Sep. 9, 2015  (JP) .................. 2015-177264

(51) Int. Cl.
| | |
|---|---|
| H01L 29/00 | (2006.01) |
| H01L 45/00 | (2006.01) |
| H01L 21/28 | (2006.01) |
| H01L 29/51 | (2006.01) |

(52) U.S. Cl.
CPC ...... *H01L 45/147* (2013.01); *H01L 21/28017* (2013.01); *H01L 29/517* (2013.01); *H01L 45/1233* (2013.01); *H01L 45/1253* (2013.01); *H01L 2924/13091* (2013.01)

(58) Field of Classification Search
CPC ............. H01L 29/517; H01L 21/28017; H01L 21/31645; H01L 2924/13091
See application file for complete search history.

(56) References Cited

U.S. PATENT DOCUMENTS

| | | | | |
|---|---|---|---|---|
| 2007/0278948 A1* | 12/2007 | Sakata | ................ | C09K 11/574 |
| | | | | 313/506 |
| 2008/0144377 A1* | 6/2008 | Watanabe | .......... | G11C 16/0408 |
| | | | | 365/185.05 |
| 2010/0038729 A1* | 2/2010 | Eimori | .................... | H01L 27/11 |
| | | | | 257/411 |
| 2013/0043526 A1* | 2/2013 | Iyer | ....................... | H01L 29/417 |
| | | | | 257/330 |
| 2014/0254274 A1 | 9/2014 | Shuto et al. | | |
| 2015/0001539 A1* | 1/2015 | Smith | .................. | B81B 3/0086 |
| | | | | 257/57 |
| 2015/0102431 A1* | 4/2015 | Chi | ................... | H01L 21/28185 |
| | | | | 257/411 |

(Continued)

FOREIGN PATENT DOCUMENTS

| | | |
|---|---|---|
| JP | 2009-230834 | 10/2009 |
| JP | 2009-230835 | 10/2009 |
| JP | 2014-175020 | 9/2014 |

OTHER PUBLICATIONS

Johannes Muller et al. "Ferroelectric Hafnium Oxide, A Game Changer to FRAM?" 14th Non-Volatile Memory Technology Symposium (NVMTS 2014), 2014, 7 Pages.

*Primary Examiner* — Ngan Ngo
(74) *Attorney, Agent, or Firm* — Oblon, McClelland, Maier & Neustadt, L.L.P.

(57) ABSTRACT

According to one embodiment, an insulator includes a material including barium and hafnium oxide. The material has a crystal structure of a space group $Pbc2_1$.

20 Claims, 11 Drawing Sheets

(56) References Cited

U.S. PATENT DOCUMENTS

| | | | |
|---|---|---|---|
| 2015/0236118 A1* | 8/2015 | Chan | H01L 29/6659 |
| | | | 257/408 |
| 2016/0225915 A1* | 8/2016 | Qiu | H01L 29/78696 |
| 2016/0347969 A1* | 12/2016 | Lee | C09D 183/06 |

* cited by examiner

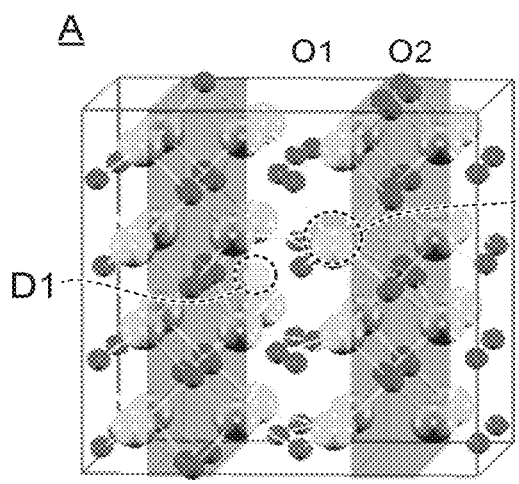
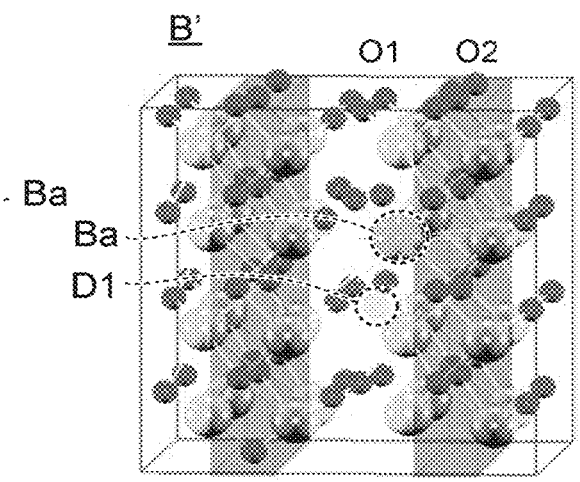
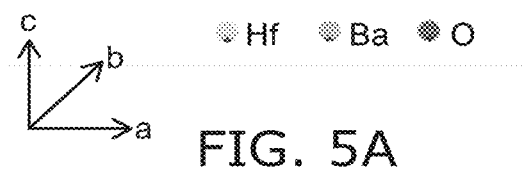
FIG. 5A
FIG. 5B
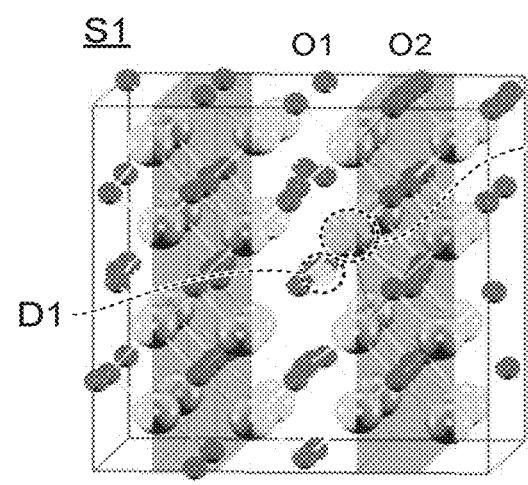
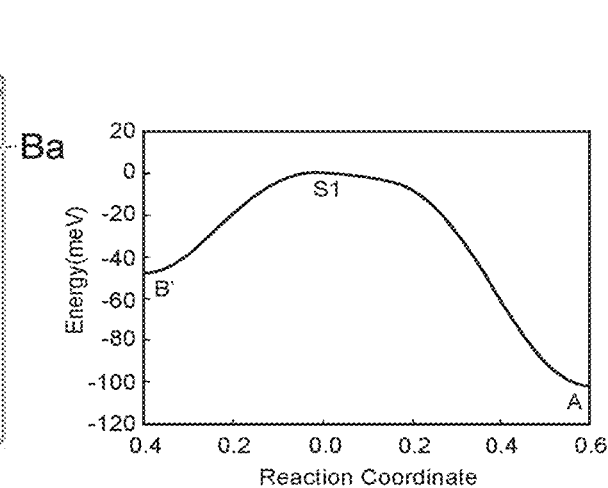
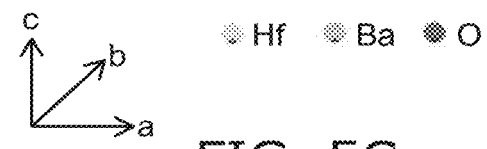
FIG. 5C
FIG. 5D

INSULATOR AND MEMORY DEVICE

CROSS-REFERENCE TO RELATED APPLICATIONS

This application is based upon and claims the benefit of priority from Japanese Patent Application No. 2015-177264, filed on Sep. 9, 2015; the entire contents of which are incorporated herein by reference.

FIELD

Embodiments described herein relate generally to an insulator and a memory device.

BACKGROUND

Research has been made on insulator including hafnium oxide. For instance, a thin film of e.g. HfSiO and HfZrO of approximately 10 nm exhibits ferroelectricity. Such an insulator has drawing attention because of its application to e.g. the CMOS process. It is desired to obtain large polarization (spontaneous polarization) in such an insulator.

BRIEF DESCRIPTION OF THE DRAWINGS

FIGS. 5A to 5D illustrate $Hf_{1-x}Ba_xO_{2-\delta}$ having a crystal structure of space group $Pbc2_1$;

DETAILED DESCRIPTION

Figure 1:
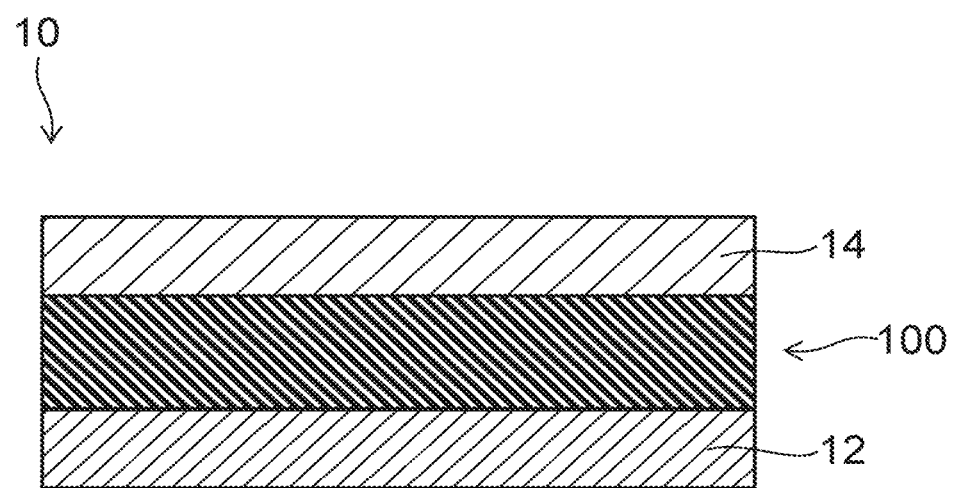
FIG. 1 is a schematic sectional view illustrating an insulating film according to an embodiment.

According to one embodiment, an insulator includes a material including barium and hafnium oxide. The material has a crystal structure of a space group $Pbc2_1$.

According to one embodiment, a memory device includes a first conductive layer, a second conductive layer, and a first insulating layer. The first insulating layer is provided between the first conductive layer and the second conductive layer and includes a material including barium and hafnium oxide. The material has a crystal structure of a space group $Pbc2_1$.

According to one embodiment, a memory device includes a first conductive layer, a semiconductor layer, and a first insulating layer. The first insulating layer is provided between the first conductive layer and the semiconductor layer and includes a material including barium and hafnium oxide. The material has a crystal structure of a space group $Pbc2_1$.

Embodiments will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In this specification and the drawings, components similar to those described previously with reference to earlier figures are labeled with like reference numerals, and the detailed description thereof is omitted appropriately.

FIG. 1 is a schematic sectional view illustrating an insulating film according to an embodiment.

The insulating film 100 (insulator) according to the embodiment includes a material containing barium (Ba) and hafnium oxide ($HfO_2$). In other words, the material of the insulating film 100 is $HfO_2$ doped with Ba. For instance, the concentration of Ba doped in $HfO_2$ is not less than 1 atomic percent (at. %) and not more than 9 at. %. That is, the material of the insulating film 100 is e.g. $Hf_{1-x}Ba_xO_{2-\delta}$ ($0.01 \leq x \leq 0.09$).

The crystal structure of the material (HfBaO) of the insulating film 100 is space group $Pbc2_1$. Information on the crystal structure is obtained by e.g. X-ray diffraction. The thickness of the insulating film 100 is e.g. not less than 3 nanometers (nm) and not more than 30 nm.

In the example shown in FIG. 1, the insulating film 100 is provided between a conductive layer 12 (first conductive layer) and a conductive layer 14 (second conductive layer). The insulating film 100 is in contact with the conductive layer 12 and the conductive layer 14. That is, FIG. 1 illustrates a structure body (capacitor 10) having an MFM (metal/ferroelectric/metal) structure.

The insulating film 100 according to the embodiment does not necessarily need to be in contact with the conductive layer. As described later, the insulating film 100 may be in contact with a semiconductor or insulator, and used as part of the device.

FIGS. 2A to 2F are graphs illustrating the characteristics of the insulating film.

These graphs show the voltage-polarization characteristics of the insulating film measured by the capacitor having the MFM structure shown in FIG. 1. The voltage-polarization characteristics can be measured using e.g. a Sawyer-Tower circuit.

Figure 2A:
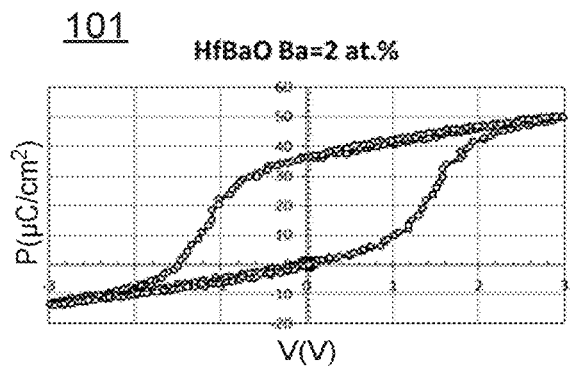
FIGS. 2A to 2F illustrate the characteristics of insulating films.
Figure 2B:
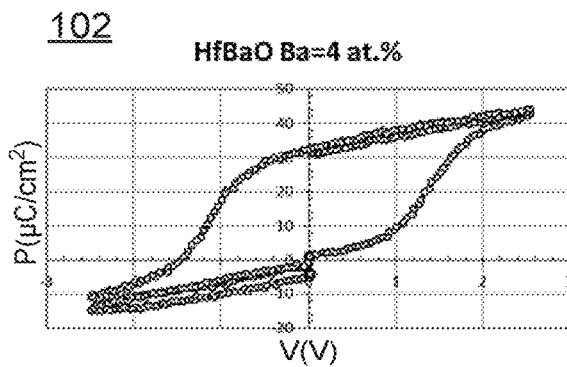
Figure 2C:
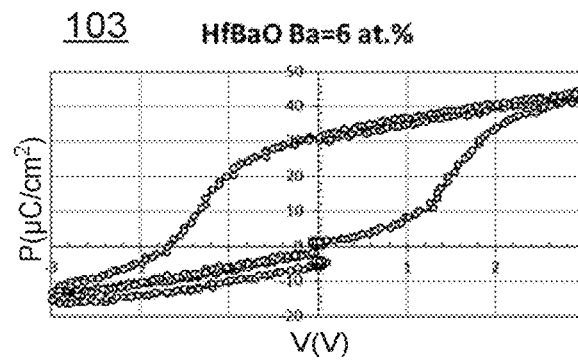

FIGS. 2A to 2C illustrate the characteristics of insulating films 101-103 according to the embodiment. A description similar to that of the insulating film 100 shown in FIG. 1 is applied to each of the insulating films 101-103. The concentration of Ba in the material of the insulating film 101 of FIG. 2A is 2 at. %. The concentration of Ba in the material of the insulating film 102 of FIG. 2B is 4 at. %. The concentration of Ba in the material of the insulating film 103 of FIG. 2C is 6 at. %.

Figure 2D:
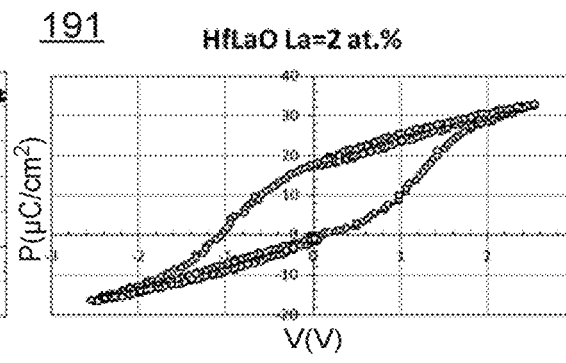
Figure 2E:
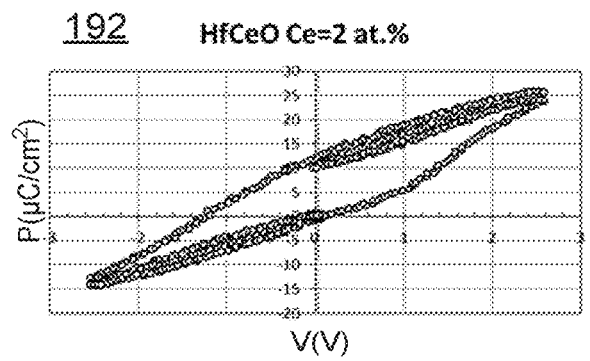
Figure 2F:
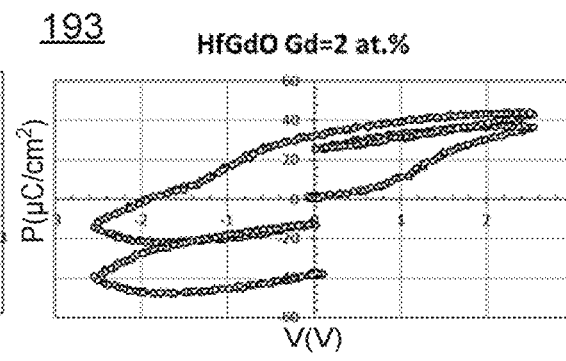

FIGS. 2D to 2F illustrate the characteristics of insulating films 191-193 according to a reference example. FIG. 2D shows the characteristic of the insulating film 191 of HfO$_2$ doped with 2 at. % La. FIG. 2E shows the characteristic of the insulating film 192 of HfO$_2$ doped with 2 at. % Ce. FIG. 2F shows the characteristic of the insulating film 193 of HfO$_2$ doped with 2 at. % Gd.

The insulating films in FIGS. 2A to 2F are different in one of the element doped in hafnium oxide and its concentration. The rest of the formation condition and the measurement condition are common. For instance, the material of the insulating films according to the reference example also has a crystal structure of space group Pbc2$_1$. For instance, all the devices used to form the insulating films are common.

The horizontal axis of each graph represents the voltage V (V) applied to the insulating film. The vertical axis of each graph represents the polarization P ($\mu$C/cm$^2$) of the insulating film. When the voltage V applied to these insulating films is changed, the magnitude and direction of the polarization P is changed. A hysteresis is observed in the voltage-polarization characteristics. That is, these insulating films have ferroelectricity. For instance, the voltage V is changed from 0 to approximately 3 V, and set to 0 V again. The polarization P (remnant polarization) observed at this time corresponds to the spontaneous polarization Ps.

As shown in FIGS. 2A to 2C, the insulating films 101-103 according to the embodiment have large spontaneous polarization Ps, approximately 30-35 $\mu$C/cm$^2$. On the other hand, as shown in FIGS. 2D to 2F, the insulating films according to the reference example have relatively small spontaneous polarization Ps.

Besides the insulating films in FIGS. 2A to 2F, a plurality of insulating films made of Hf$_{1-x}$M$_x$O$_{2-\delta}$ were fabricated and similarly characterized. Here, the element M is one of Ba, La, Gd, and Ce. For each element M, insulating films were fabricated and characterized for various compositions in the range of $0.00 \leq x \leq 0.20$. Also for these insulating films, the formation condition except the element doped in hafnium oxide and its concentration is common.

Figure 3:
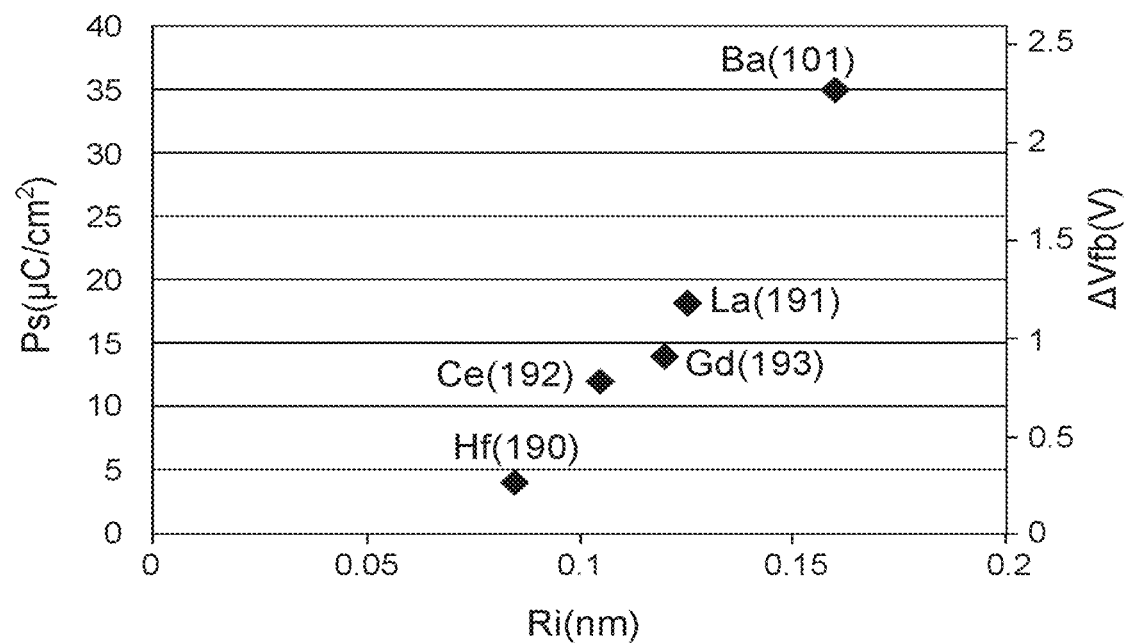
FIG. 3 is a schematic diagram illustrating the characteristics of the insulating film.

High spontaneous polarization is obtained in the range of $0.01 \leq x \leq 0.06$ for the element M being Ba, in the range of $0.01 \leq x \leq 0.04$ for the element M being La, in the range of $0.01 \leq x \leq 0.04$ for the element M being Gd, and in the range of $0.01 \leq x \leq 0.02$ for the element M being Ce. The spontaneous polarization Ps is maximized at x=0.02 for any of the above elements M. The concentration of Ba in HfBaO is preferably not less than 1 at. % and not more than 4 at. %, more preferably 2 at. %. FIG. 3 is a schematic diagram illustrating the characteristics of the insulating film.

The left vertical axis of FIG. 3 represents the spontaneous polarization Ps ($\mu$C/cm$^2$) in the aforementioned insulating films 101, 191-193. That is, FIG. 3 shows the spontaneous polarization Ps for the composition of x=0.02.

The horizontal axis of FIG. 3 represents the ion radius Ri (nm) of the element doped in hafnium oxide. The ion radius Ri (nm) is the ion radius of the doped element coordinated with seven oxygen atoms. FIG. 3 also shows the spontaneous polarization Ps of the undoped insulating film 190 (i.e., HfO$_2$). The ion radius Ri for the insulating film 190 is the ion radius of Hf.

As shown in FIG. 3, the spontaneous polarization Ps ($\mu$C/cm$^2$) tends to increase with the increase of the ion radius Ri (nm). Thus, the inventor has discovered that large spontaneous polarization occurs in hafnium oxide having a crystal structure of space group Pbc2$_1$ and doped with Ba.

Figure 4A:
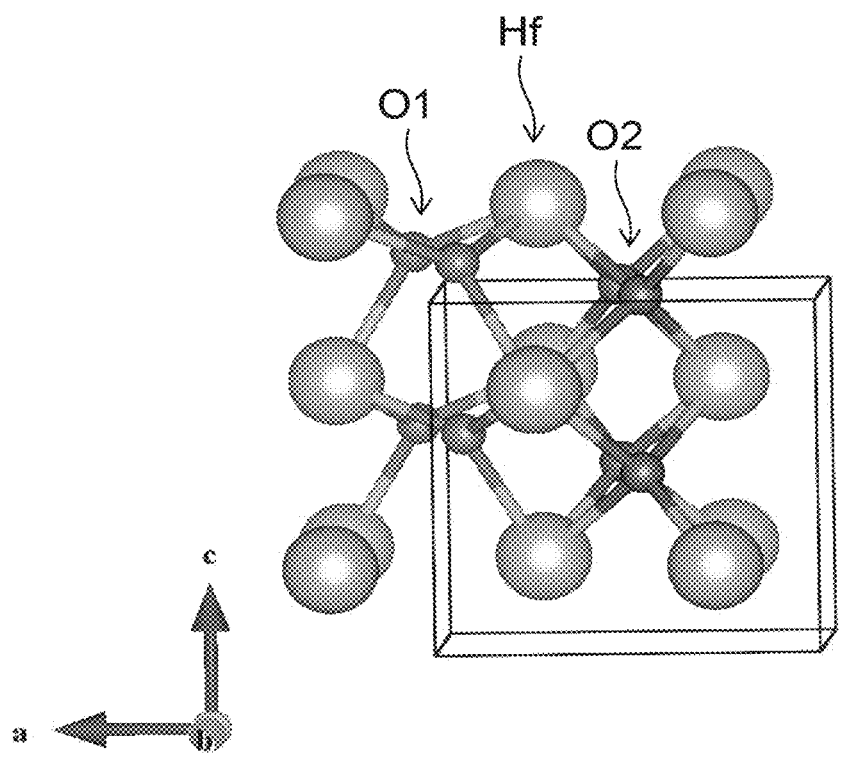
FIGS. 4A and 4B are schematic views illustrating the hafnium oxide having a crystal structure of space group $Pbc2_1$.
Figure 4B:
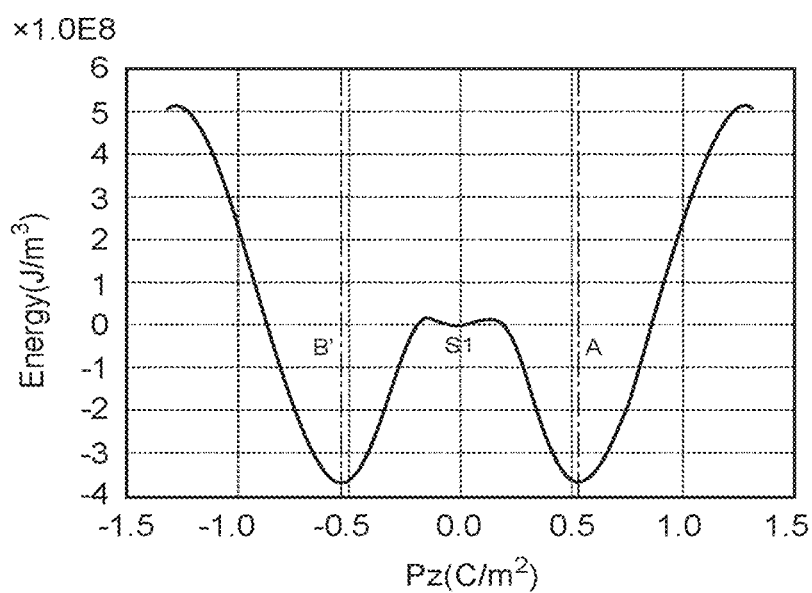

FIGS. 4A and 4B are schematic views illustrating hafnium oxide having a crystal structure of space group Pbc2$_1$.

The unit cell of HfO$_2$ having the crystal structure of space group Pbc2$_1$ before application of electric field has one position of the Hf atom. On the other hand, the unit cell of HfO$_2$ having the crystal structure of space group Pbc2$_1$ before application of electric field has two positions of the O atoms. More specifically, as shown in FIGS. 4A and 4B, an O atom is located at site O1, and another O atom is located at site O2. The O atom located at the site O1 has no inversion symmetry in the c-axis direction. For instance, the distance between the site populated with the Hf atom and the site O1 may be shorter or longer than the distance between the site populated with the Hf atom and the site O2. Thus, polarization occurs in the c-axis direction by the positive charge in the Hf$^{4+}$ plane perpendicular to the c-axis and the negative charge in the O$^{2-}$ plane of the site O1 perpendicular to the c-axis.

For instance, application of electric field to HfO$_2$ having the crystal structure of space group Pbc2$_1$ changes the position in the c-axis direction of the O atom located at the site O1. In HfO$_2$, the distance between Hf$^{4+}$ and O$^{2-}$ changes and inverts the polarization direction.

According to first-principle calculation, as shown in FIG. 4B, HfO$_2$ having the crystal structure of space group Pbc2$_1$ has three stable points A, S1, and B' with regard to polarization (Pz). For instance, the energy is minimized at the stable points A, B. The polarization corresponding to the stable point A and the polarization corresponding to the stable point B' are in opposite directions to each other. The stable point S1 is located in the middle of the stable point A and the stable point B' and corresponds to Pz=0.

In a unit cell of HfO$_2$ doped with Ba, Hf atoms are partly replaced by Ba atoms. That is, the Ba atom is placed at the site of the Hf atom shown in FIG. 4A. For instance, Hf$^{4+}$ coordinated with seven oxygen atoms is replaced by Ba$^{2+}$ coordinated with seven oxygen atoms. Thus, oxygen deficiency is introduced in the crystal. It is considered that in Hf$_{1-x}$Ba$_x$O$_{2-\delta}$, the oxygen deficiency induces polarization inversion.

There are two possible positions subjected to oxygen deficiency, i.e., the site O1 and the site O2 described above. The investigation by the inventor has revealed by first-principle calculation that large spontaneous polarization as shown in FIG. 3 occurs when oxygen deficiency is located at the site O2. Thus, it is considered that in the insulating film according to the embodiment, oxygen deficiency is located at the site O2.

FIGS. 5A to 5C illustrate Hf$_{1-x}$Ba$_x$O$_{2-\delta}$ having a crystal structure of space group Pbc2$_1$.

FIG. 5A shows the state corresponding to the aforementioned stable point A. FIG. 5B shows the state corresponding to the aforementioned stable point B'. FIG. 5C shows the state corresponding to the aforementioned stable point S1.

In the example shown in FIGS. 5A to 5D, in contrast to the insulating film according to the embodiment, oxygen deficiency D1 is located at the site O1.

FIG. 5D is a graph illustrating the position of oxygen deficiency D1 produced at the site O1 and the energy. The energy is represented in terms of energy per one oxygen atom. This relationship is obtained by first-principle calculation.

As shown in FIG. 5D, the energy is low in the state corresponding to the stable point A and the state corresponding to the stable point B'. However, in FIG. 5D, in contrast to HfO$_2$ shown in FIG. 4B, the energy in the state corresponding to the stable point A is lower than the energy in the state corresponding to the stable point B'. Thus, in Hf$_{1-x}$Ba$_x$O$_{2-\delta}$ with oxygen deficiency D1 located at the site O1, the energy curve is asymmetric with respect to the stable point S1. This means that the hysteresis curve of voltage-polarization characteristics is made asymmetric when oxygen deficiency D1 occurs at the site O1.

On the other hand, for instance, as shown in FIG. 2A, the hysteresis curve of the voltage-polarization characteristics of the insulating film according to the embodiment is nearly symmetric between the shape of the curve for positive voltage and the shape of the curve for negative voltage. Thus, it is considered that in the insulating film according to the embodiment, the oxygen deficiency D1 is located at the site O2 rather than the site O1.

Figure 6A:
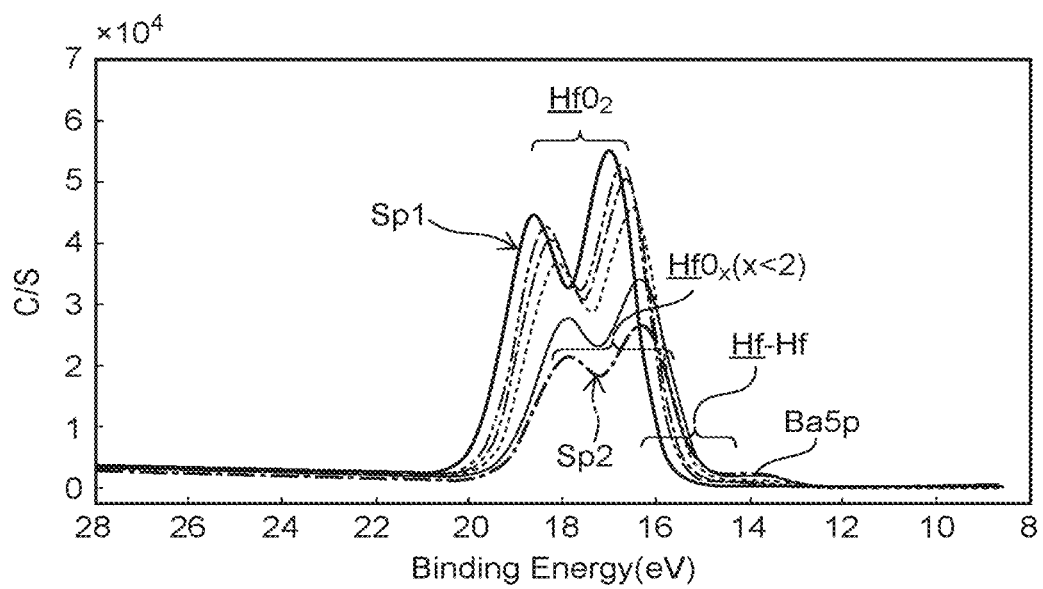
FIGS. 6A and 6B are graphs illustrating the characteristics of the insulating film.
Figure 6B:
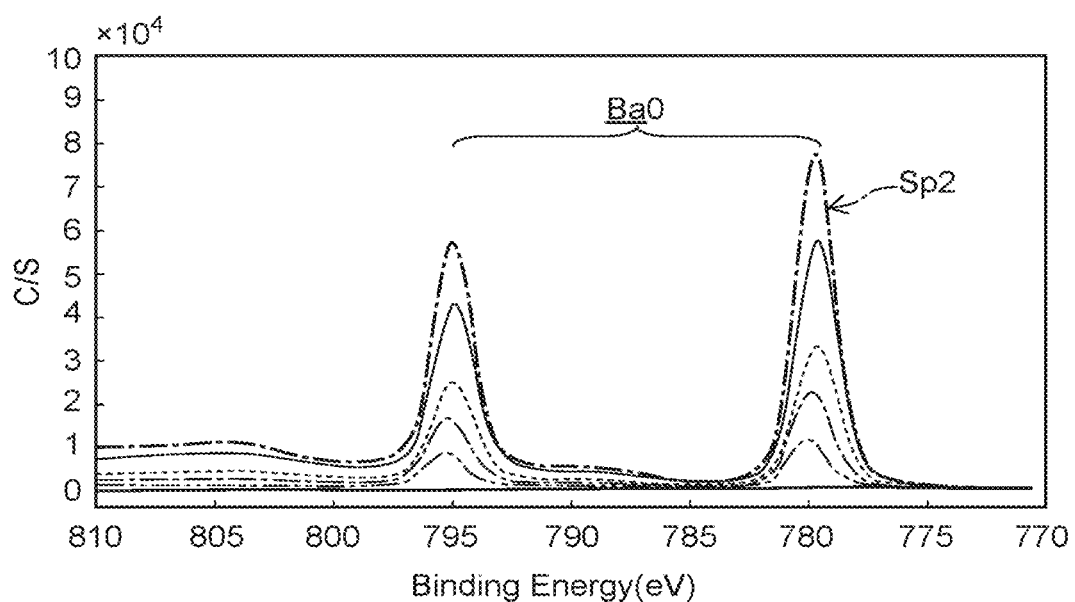

FIGS. 6A and 6B are graphs illustrating the characteristics of the insulating film.

FIGS. 6A and 6B show energy spectra of $Hf_{1-x}Ba_xO_{2-\delta}$ having a crystal structure of space group $Pbc2_1$ by X-ray photoelectron spectroscopy (XPS). FIG. 6A shows 4f peaks of Hf and 5p peaks of Ba. FIG. 6B shows 3d peaks of Ba.

A plurality of curves in each graph represent the measurement results of samples different in composition ratio x. The spectrum Sp1 shown in FIG. 6A is the measurement result for x=0, i.e., $HfO_2$. In $HfO_2$, 4f peaks occur at 18.6 eV and 17.0 eV corresponding to $Hf^{4+}$.

The spectrum Sp2 is the measurement result of the insulating film according to the embodiment (i.e., $Hf_{1-x}Ba_xO_{2-\delta}$, $HfO_2$ doped with Ba). Doping $HfO_2$ with Ba decreases the spectral intensity of the 4f peak corresponding to $Hf^{4+}$, and shifts the peak position to the low energy side. In $HfO_2$ doped with Ba, peaks corresponding to $Hf^{3+}$, $Hf^{2+}$, or $Hf^{1+}$ are observed in a small amount.

In the insulating film according to the embodiment, for instance, the shift amount of the peak at 18.6 eV is not less than 0.1 eV and not more than 0.9 eV. The shift amount of the peak at 17.0 eV is not less than 0.2 eV and not more than 0.7 eV. That is, a peak located at not less than 17.7 eV and not more than 18.5 eV and a peak located at not less than 16.3 eV and not more than 16.8 eV are observed in the insulating film according to the embodiment.

Here, the structure of the insulating film according to the embodiment cannot be obtained when the insulating film is fabricated under the sputtering condition exhibiting a peak corresponding to nulvalent Hf, i.e., Hf metal. Preferably, the peak of $Hf^{1+}$ is also small. Preferably, the peak of $Hf^{2+}$ is smaller than the peak of $Hf^{3+}$. In the insulating film according to the embodiment, the peak of $Hf^{2+}$ and the peak of $Hf^{1+}$ do not need to be observed.

Furthermore, δ is estimated at approximately 0.04 from the XPS peaks in $Hf_{0.98}Ba_{0.02}O_{2-\delta}$. Thus, it is found that anion sites are deficient in the fluorite-type $MX_2$ crystal structure. Assuming the composition of $(HfO_2)_{0.98}(BaO)_{0.02}O_{-\epsilon}$, ϵ is estimated at approximately 0.02. Thus, it is found that oxygen is more deficient than the stoichiometric ratio.

The 3d peaks of Ba are located e.g. near 795.5 eV and near 780.3 eV. As shown in FIG. 6B, in the insulating film according to the embodiment, a peak is observed between a position 0.2 eV lower than 795.5 eV and a position 0.7 eV lower than 795.5 eV. A peak is observed between a position 0.2 eV lower than 780.3 eV and a position 0.7 eV lower than 780.3 eV. That is, a peak located at not less than 794.8 eV and not more than 795.3 eV and a peak located at not less than 779.6 eV and not more than 780.1 eV are observed in the insulating film according to the embodiment.

The intensity of the peaks shown in FIG. 6B becomes higher with the increase of the doping amount (x) of Ba. On the other hand, the peak position is less susceptible to the doping amount (x). This implies that oxygen deficiency is located at a site far from Ba that modulates the potential (i.e., at the site O2) in the insulating film according to the embodiment.

Figure 7A:
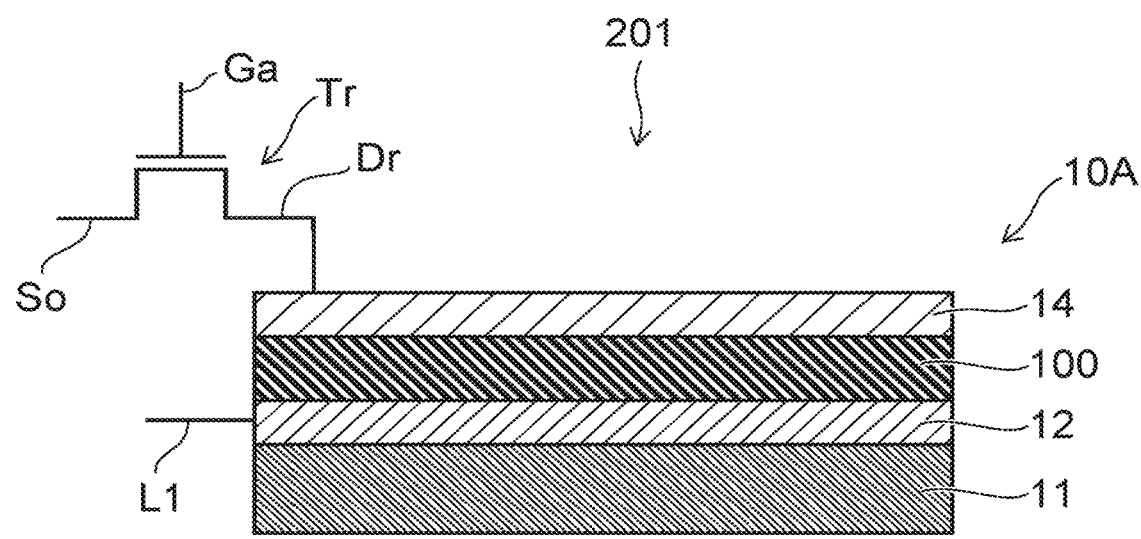
FIGS. 7A to 7C are schematic sectional views illustrating a memory element based on the insulating film according to the embodiment.
Figure 7B:
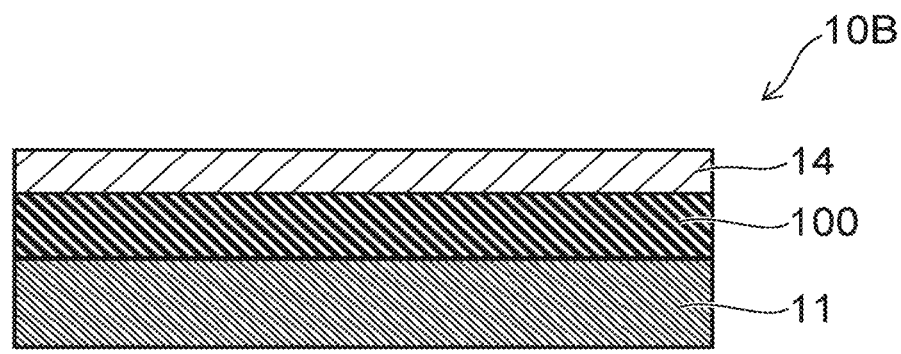
Figure 7C:
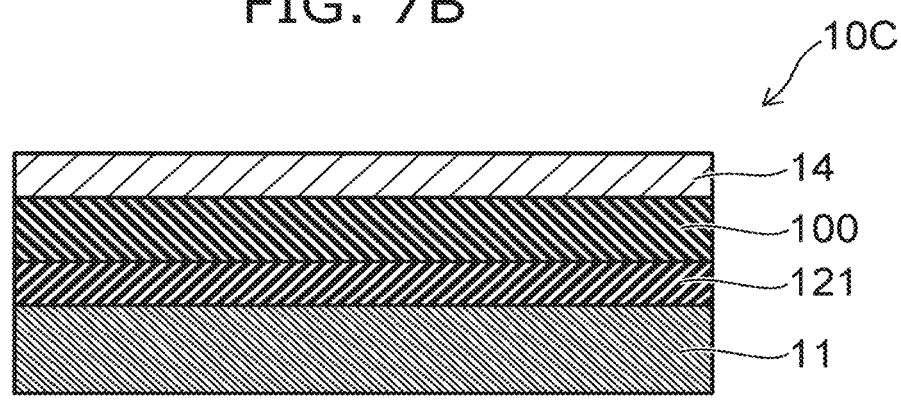

FIGS. 7A to 7C are schematic sectional views illustrating a memory element based on the insulating film according to the embodiment.

These figures illustrate the basic structure of the MFM-type memory element according to the embodiment. This memory element is e.g. a nonvolatile memory element.

As shown in FIG. 7A, the memory element 10A includes a semiconductor layer 11, a conductive layer 12, an insulating film 100 (first insulating layer), and a conductive layer 14.

The conductive layer 12 and the conductive layer 14 are e.g. electrode films. The semiconductor layer 11 is e.g. a substrate. The capacitor 10 described with reference to FIG. 1 is formed on the substrate.

The memory element 10A has a structure in which a ferroelectric film is used for the capacitor insulating film of the MIMS (metal-insulator-metal-silicon) type. Thus, nonvolatile charge is accumulated in the capacitor electrode, and the accumulated charge is read. However, the memory element according to the embodiment does not necessarily need to use the MFM-type structure.

For instance, at write time, a voltage is applied between the conductive layer 12 and the conductive layer 14 to change the polarization direction of the insulating film 100. The charge accumulated in the capacitor electrodes (conductive layer 12 and conductive layer 14) changes with the polarization direction of the insulating film 100.

A selection element or a selection amplification element may be provided to read the charge. The selection element is e.g. a diode connected in series to the capacitor electrode. The selection amplification element is e.g. a transistor with the source or drain connected to the capacitor electrode.

As an example, FIG. 7A shows a memory device 201 including a transistor Tr and the memory element 10A. The memory device 201 has a structure of FeRAM. In this example, the conductive layer 12 is connected to the wiring L1. The conductive layer 14 is connected to the drain electrode Dr of the transistor Tr. For instance, the gate electrode Ga of the transistor Tr is connected to a word line. The source electrode So of the transistor Tr is connected to a bit line.

At write time, the gate electrode Ga is selected by the word line. A voltage is applied to the insulating film 100 through the bit line and the wiring L1. At read time, the current flowing between the bit line and the wiring L1 is read.

Next, an example of a method for manufacturing such a memory element is described.

The semiconductor layer 11 is e.g. a silicon substrate. It is preferable to use a monocrystalline silicon substrate with a (100) surface exposed. Besides, the semiconductor layer 11 may be a substrate capable of forming a memory peripheral circuit thereon such as monocrystalline germanium substrate, SiGe epitaxial substrate, InP substrate, GaN substrate, GaAs substrate, or InGaZnO substrate.

For instance, a conductive layer 12 is formed by sputtering technique on the silicon substrate with a (100) surface exposed. The conductive layer 12 includes e.g. at least one of TiN, highly-doped polysilicon, TaN, TW, HfN, ZrN, TaAlN, WAlN, HfAlN, ZrAlN, and Ir. The layer formed from these materials is characterized in e.g. being less miscible with $HfO_2$ film and having high oxidation resistance. The layer formed from these materials is less prone to deformation and structure disturbance by heat treatment at approximately 600-800° C. described below. The thickness of the conductive layer 12 is e.g. 10 nm or less from the viewpoint of device miniaturization and cost reduction. The Young's modulus of the material used for the conductive layer 12 is preferably not less than 230 gigapascals (GPa) and not more than 600 GPa. When the Young's modulus of the conductive layer 12 is too low, it is difficult to apply a stress to the HfBaO film subsequently formed on the conductive layer 12 such that the HfBaO film maintains a quasi-stable structure. When the Young's modulus of the conductive layer 12 is too high, the HfBaO film passes over the desired quasi-stable structure to another quasi-stable structure.

Besides sputtering technique, formation of the conductive layer 12 may be based on ALD (atomic layer deposition) technique, CVD (chemical vapor deposition) technique, or EB (electron beam) evaporation technique.

The conductive layer 12 does not necessarily need to be provided. For instance, the memory element 10B shown in FIG. 7B does not include the conductive layer 12. In the memory element 10B, for instance, the insulating film 100 is provided directly on the semiconductor layer 11. The rest of the memory element 10B is similar to the memory element 10A.

The conductive layer 12 may be replaced by an insulating layer. For instance, the memory element 10C shown in FIG. 7C does not include the conductive layer 12, but includes an insulating layer 121. The insulating layer 121 is located between the insulating film 100 and the semiconductor layer 11. The rest of the memory element 10C is similar to the memory element 10A. Preferably, the insulating layer 121 is intentionally formed on the semiconductor layer 11. However, the insulating layer 121 may be naturally formed in the subsequent process.

A $Hf_{1-x}Ba_xO_{2-\delta}$ film constituting an insulating film 100 is formed by sputtering technique on the conductive layer 12, the semiconductor layer 11, or the insulating layer 121. The value of x is e.g. 0.02. The thickness of the $Hf_{1-x}Ba_xO_{2-\delta}$ film is e.g. 16 nm or less. When the thickness is thicker than 16 nm, the film is less likely to be ferroelectric.

The temperature of the substrate at the time of forming the $Hf_{1-x}Ba_xO_{2-\delta}$ film is preferably room temperature. However, the temperature of the substrate may be high temperature. The sputtering condition for the $Hf_{1-x}Ba_xO_{2-\delta}$ film is preferably a condition of minimizing damage to the substrate. For instance, the sputtering gas pressure is preferably not less than 1 Pa. Preferably, the substrate and the sputtering target are placed in off-axis arrangement. The sputtering target contains Hf metal. The sputtering may be reactive sputtering in an Ar+$O_2$ atmosphere. In this case, the ratio of the flow rate of $O_2$ to the flow rate of Ar is set to 1/10 or less.

Then, a conductive layer 14 (electrode film) is formed on the $Hf_{1-x}Ba_xO_{2-\delta}$ film. The material and the like of the conductive layer 14 are similar to those of the conductive layer 12. For instance, the conductive layer 14 is a TiN film formed by sputtering technique.

Then, a semiconductor film (not shown) may be further formed on the conductive layer 14. Formation of the semiconductor film is based on e.g. ALD technique or CVD technique.

The $Hf_{1-x}Ba_xO_{2-\beta}$ film thus formed is not e.g. ferroelectric. Here, the heat treatment (heating-cooling process) described below is performed. This turns the $Hf_{1-x}Ba_xO_{2-\delta}$ film to a ferroelectric insulating film.

Figure 8:
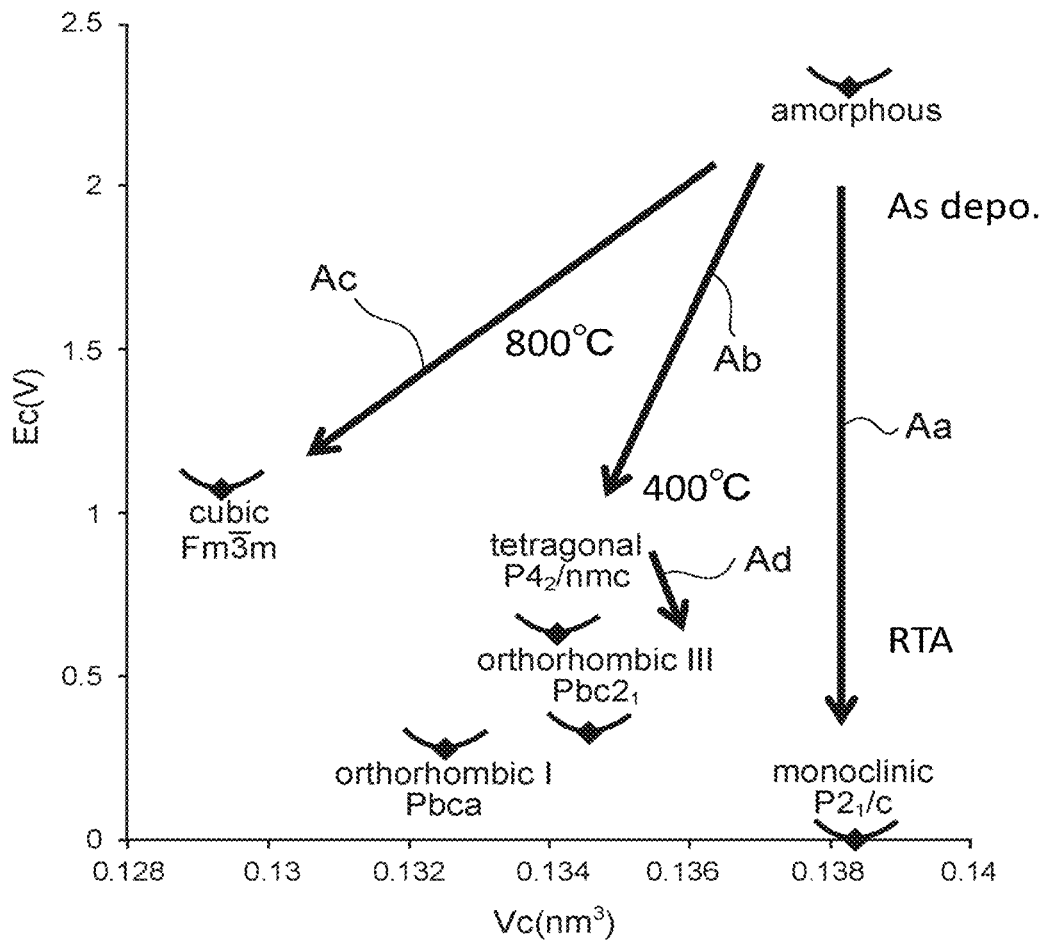
FIG. 8 is a schematic diagram illustrating the characteristics of $HfO_2$ doped with Ba.

FIG. 8 is a schematic diagram illustrating the characteristics of $HfO_2$ doped with Ba.

FIG. 8 illustrates the relationship between the formation energy Ec (V) and the crystal volume Vc ($nm^3$) for $Hf_{1-x}Ba_xO_{2-\delta}$ (x=0.02). The formation energy Ec and the crystal volume Vc are the values per $Hf_4O_8$ cell. The formation energy Ec is represented with respect to the reference (0 V) at which the crystal structure is monoclinic.

As shown in FIG. 8, the $Hf_{1-x}Ba_xO_{2-\delta}$ film is amorphous and paraelectric immediately after being formed by sputtering. Here, for instance, the amorphous $Hf_{1-x}Ba_xO_{2-\delta}$ film is heated to not less than 800° C. and then cooled at a temperature decrease speed of less than 30° C./h. Alternatively, for instance, the temperature is decreased without any constraint condition on the $Hf_{1-x}Ba_xO_{2-\delta}$ film. Alternatively, for instance, the layer above or below the $Hf_{1-x}Ba_xO_{2-\delta}$ film is made of a material having a Young's modulus less than 230 GPa or a material expanding with reaction with the $Hf_{1-x}Ba_xO_{2-\delta}$ film. Alternatively, for instance, the oxygen deficiency δ in the composition of the $Hf_{1-x}Ba_xO_{2-\delta}$ film is set to less than 0.01. Thus, the crystal structure is changed, and the formation energy Ec is decreased. As indicated by arrow Aa in FIG. 8, when the crystal volume Vc is not decreased by heat treatment, the crystal structure becomes monoclinic ($P2_1/c$). In this crystal structure, the $Hf_{1-x}Ba_xO_{2-\delta}$ film is paraelectric.

As indicated by arrow Ab in FIG. 8, for instance, the $Hf_{1-x}Ba_xO_{2-\delta}$ film is heated to not less than 800° C. and then cooled at a temperature decrease speed of not less than 30° C./h. At this time, for instance, at least one of the layers above and below the $Hf_{1-x}Ba_xO_{2-\delta}$ film is made of a material having a Young's modulus exceeding 600 GPa, or a material scarcely reacting with the $Hf_{1-x}Ba_xO_{2-\delta}$ film. Alternatively, for instance, the oxygen deficiency δ in the composition of the $Hf_{1-x}Ba_xO_{2-\delta}$ film is set to not less than 0.13 and less than 0.17. Thus, when the crystal volume Vc is greatly decreased, the crystal structure becomes tetragonal ($P4_2$/nmc) or orthorhombic I (Pbca). In these crystal structures, the $Hf_{1-x}Ba_xO_{2-\delta}$ film is antiferroelectric.

As indicated by arrow Ac in FIG. 8, for instance, the $Hf_{1-x}Ba_xO_{2-\delta}$ film is heated to not less than 800° C. and then cooled at a temperature decrease speed of not less than 30° C./h. At this time, for instance, at least one of the layers above and below the $Hf_{1-x}Ba_xO_{2-\delta}$ film is made of a material having a Young's modulus exceeding 600 GPa, or a material scarcely reacting with the $Hf_{1-x}Ba_xO_{2-\delta}$ film. Alternatively, for instance, the oxygen deficiency δ in the composition of the $Hf_{1-x}Ba_xO_{2-\delta}$ film is set to not less than 0.17. Thus, when the crystal volume Vc is further greatly decreased, the crystal structure becomes cubic ($Fm\bar{3}m$). In this crystal structure, the $Hf_{1-x}Ba_xO_{2-\delta}$ film is paraelectric.

In contrast, as indicated by arrow Ad in FIG. 8, for instance, the $Hf_{1-x}Ba_xO_{2-\delta}$ film is heated to not less than 800° C. and then cooled at a temperature decrease speed of not less than 30° C./h. At this time, for instance, at least one of the layers above and below the $Hf_{1-x}Ba_xO_{2-\delta}$ film is made of a material having a Young's modulus of not less than 230 GPa and not more than 600 GPa, or a material scarcely reacting with the $Hf_{1-x}Ba_xO_{2-\delta}$ film. Alternatively, for instance, the oxygen deficiency δ in the composition of the $Hf_{1-x}Ba_xO_{2-\delta}$ film is set to not less than 0.01 and less than 0.13. Thus, when the crystal volume Vc is moderately decreased, the crystal structure becomes orthorhombic III ($Pbc2_1$). In this crystal structure, the $Hf_{1-x}Ba_xO_{2-\delta}$ film is ferroelectric. Thus, the insulating film 100 according to the embodiment is obtained. That is, the insulating film 100 according to the embodiment can be obtained by appropriately adjusting the amount of shrinkage of the $Hf_{1-x}Ba_xO_{2-\delta}$ film in the cooling process. Ferroelectricity cannot be obtained in the case of no shrinkage or excessively large shrinkage in the $Hf_{1-x}Ba_xO_{2-\delta}$ film. Ferroelectricity can be obtained by moderately shrinking the $Hf_{1-x}Ba_xO_{2-\delta}$ film.

For instance, the thermal expansion coefficient of the layer (e.g., conductive layer 12 or conductive layer 14) in contact with the $Hf_{1-x}Ba_xO_{2-\delta}$ film is adjusted. Thus, in the cooling process, a stress corresponding to the difference between the thermal expansion coefficient of the $Hf_{1-x}Ba_xO_{2-\delta}$ film and the thermal expansion coefficient of the layer in contact with the $Hf_{1-x}Ba_xO_{2-\delta}$ film is applied to the $Hf_{1-x}Ba_xO_{2-\delta}$ film. This can adjust the amount of decrease of the crystal volume Vc (i.e., crystal structure).

When the $Hf_{1-x}Ba_xO_{2-\delta}$ film is formed by sputtering, the oxygen flow rate in the atmosphere may be adjusted. The amount of oxygen deficiency in the $Hf_{1-x}Ba_xO_{2-\delta}$ film is changed depending on the flow rate. In the heat treatment, an internal stress occurs in the film depending on the amount of oxygen deficiency. This may be used to adjust the amount of decrease of the crystal volume Vc (i.e., crystal structure). Besides, arbitrary methods may be used to shrink the $Hf_{1-x}Ba_xO_{2-\delta}$ film.

Figure 9:
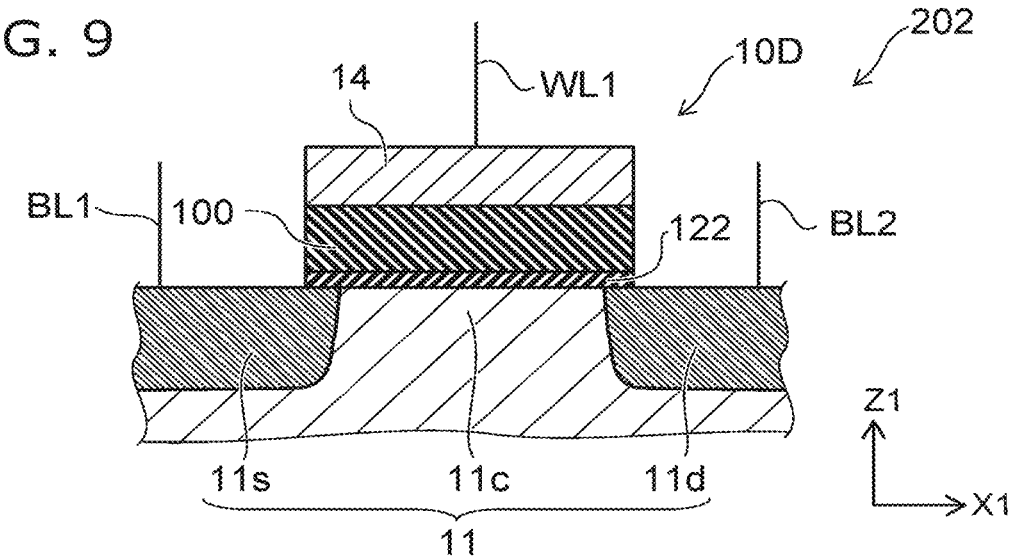
FIG. 9 is a schematic sectional view illustrating a memory device based on the insulating film according to the embodiment.

FIG. 9 is a schematic sectional view illustrating a memory device based on the insulating film according to the embodiment.

As shown in FIG. 9, the memory device 202 includes a memory element 10D. The memory element 10D includes a semiconductor layer 11, an insulating film 100, and a conductive layer 14. The memory element 10D is e.g. a ferroelectric field effect transistor (FeFET).

The semiconductor layer 11 is e.g. a silicon substrate. The semiconductor layer 11 includes a first region 11s, a second region 11d, and a third region 11c. The second region 11d is spaced from the first region 11s in the X1-direction. The third region 11c is located between the first region 11s and the second region 11d. The first region 11s and the second region 11d contain impurity of a first conductivity type (one of n-type and p-type). The n-type impurity is e.g. phosphorus (P) or arsenic (As). The p-type impurity is e.g. boron (B). The impurity concentration of the first conductivity type in the third region 11c is lower than the impurity concentration of the first conductivity type in the first region 11s and lower than the impurity concentration of the first conductivity type in the second region 11d. For instance, the first region 11s is a source region. The second region 11d is a drain region. The third region 11c is a channel region.

The conductive layer 14 is spaced from the semiconductor layer 11 in the Z1-direction perpendicular to the X1-direction. The conductive layer 14 is provided opposite to the third region 11c and juxtaposed with the third region 11c in the Z1-direction. The conductive layer 14 is e.g. a gate electrode.

The insulating film 100 is provided between the conductive layer 14 and the third region 11c.

In this example, an insulating layer 122 is provided between the insulating film 100 and the semiconductor layer 11. The insulating layer 122 is e.g. a gate insulating film and includes silicon oxide. However, the insulating layer 122 does not need to be provided.

For instance, the memory device 202 further includes a word line WL1, a first bit line BL1, and a second bit line BL2. The conductive layer 14 is electrically connected to the word line WL1. The first region 11s is electrically connected to the bit line BL1. The second region 11d is electrically connected to the bit line BL2.

At write time, the word line WL1 is used to apply voltage between the conductive layer 14 and the semiconductor layer 11. Thus, a voltage is applied to the insulating film 100 to change the polarization direction. The flat band voltage Vfb of the transistor is changed in response to the change of the polarization direction. That is, the threshold of the transistor is changed. At read time, the word line WL1 is used to select a memory cell. The written information is read using the current flowing between the first region 11s and the second region 11d.

The insulating film 100 according to the embodiment has large spontaneous polarization Ps as described above. Thus, the change (ΔVfb) of the flat band voltage Vfb in response to the change of the polarization direction is large. This can increase the change of the threshold of the transistor.

The right vertical axis of FIG. 3 represents the value of ΔVfb (V) in the case where the insulating film 100 is replaced by other insulating films in a transistor having a similar structure to the memory element 10D. In the case of using the insulating film according to the embodiment, it is estimated that ΔVfb as large as not less than 2 V is obtained. Thus, for instance, the stability of operation is improved.

Figure 10A:
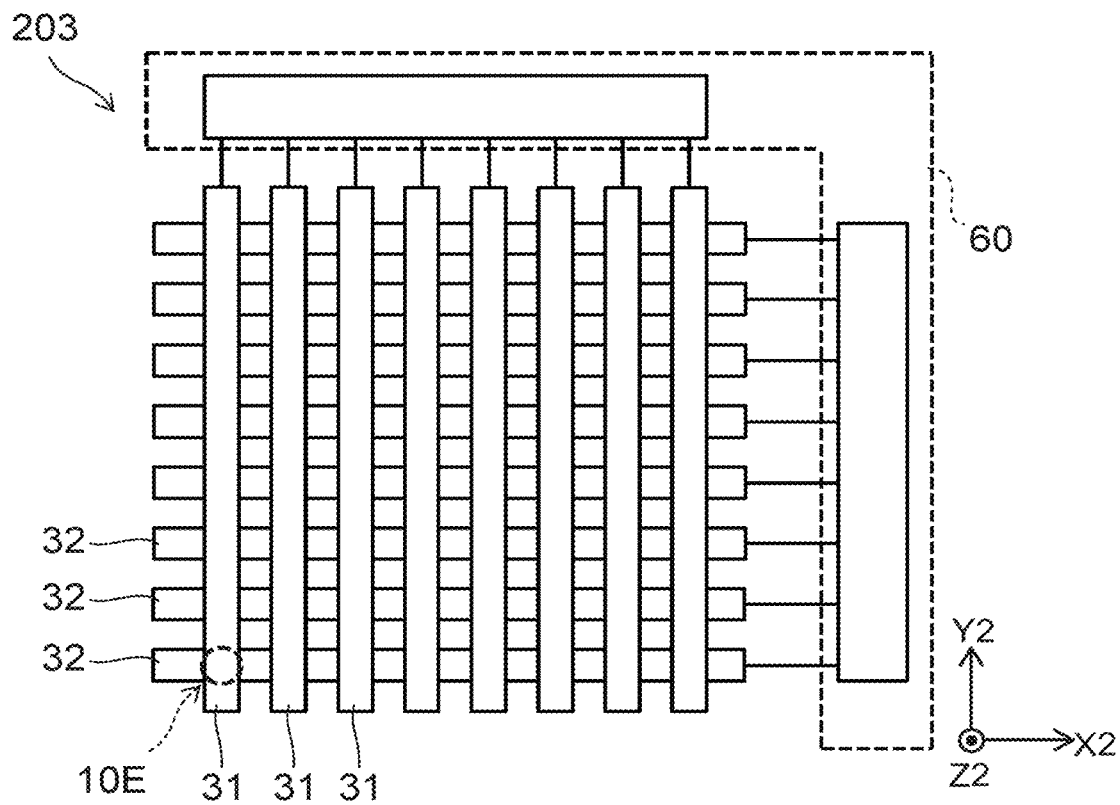
FIGS. 10A and 10B are schematic views illustrating a memory device based on the insulating film according to the embodiment.
Figure 10B:
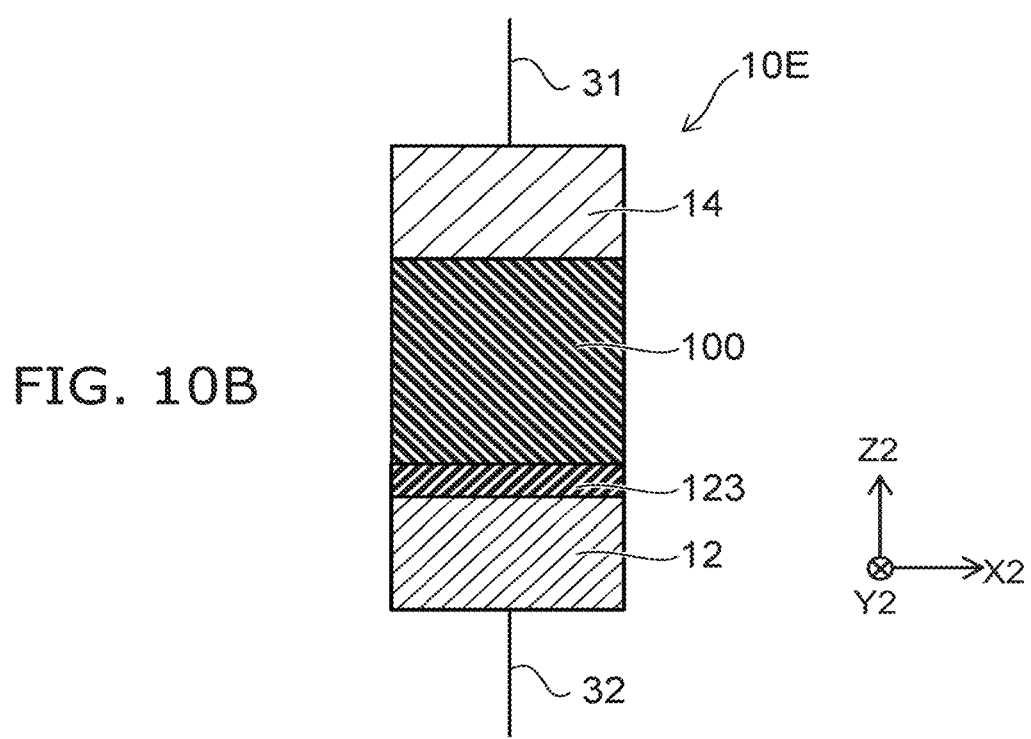

FIGS. 10A and 10B are schematic views illustrating a memory device based on the insulating film according to the embodiment.

FIG. 10A is a schematic plan view illustrating a memory device 203. As shown in FIG. 10A, the memory device 203 includes a plurality of first wirings 31, a plurality of second wirings 32, memory elements 10E, and a control section 60.

The plurality of first wirings 31 each extend in the Y2-direction and are spaced from each other in the X2-direction crossing the Y2-direction. The plurality of second wirings 32 each extend in the X2-direction and are spaced from each other in the Y2-direction.

The memory element 10E is provided between each first wiring 31 and each second wiring 32. The memory device 203 is e.g. a nonvolatile memory device of the cross-point type. The first wiring 31 corresponds to one of the word line and the bit line. The second wiring 32 corresponds to the other of the word line and the bit line.

FIG. 10B is a schematic sectional view illustrating the memory element 10E shown in FIG. 10A. As shown in FIG. 10B, the memory element 10E includes a conductive layer 12, an insulating layer 123 (second insulating layer), an insulating film 100 (first insulating layer), and a conductive layer 14. The memory element 10E is e.g. an FTJ (ferroelectric tunnel junction) element.

The insulating film 100 is provided between the conductive layer 12 and the conductive layer 14. The insulating layer 123 is provided between the insulating film 100 and the conductive layer 12. The conductive layer 14 is electrically connected to the first wiring 31. The conductive layer 12 is electrically connected to the second wiring 32.

The thickness (the length along the direction from the conductive layer 12 toward the conductive layer 14) of the insulating layer 123 is e.g. not less than 0.1 nm and not more than 2.0 nm. The insulating layer 123 is made of an insulator such as silicon oxide. Because the thickness of the insulating layer 123 is thin, the insulating layer 123 functions as e.g. a tunnel insulating film. The insulating layer 123 is e.g. a rectifying layer. The insulating layer 123 is e.g. a protective layer. The insulating layer 123 is e.g. a gate insulating film.

The end part of the first wiring 31 and the end part of the second wiring 32 are connected to the control section 60 shown in FIG. 10A. The control section 60 controls the voltage between the first wiring 31 and the second wiring 32. Thus, a voltage is applied to the insulating film 100 and the insulating layer 123 through the conductive layer 12 and the conductive layer 14.

At write time, the polarization direction of the insulating film 100 is changed by applying voltage to the insulating film 100. The potential barrier in the insulating film 100 is changed with the polarization direction. Thus, the resistance of the insulating film 100 is changed depending on the polarization direction. At read time, the written information is read using the current flowing between the conductive layer 12 and the conductive layer 14.

Use of the insulating film 100 having large spontaneous polarization can increase the change of the resistance in response to the change of the polarization direction. Also in the memory device 203, for instance, the stability of operation is improved.

Figure 11:
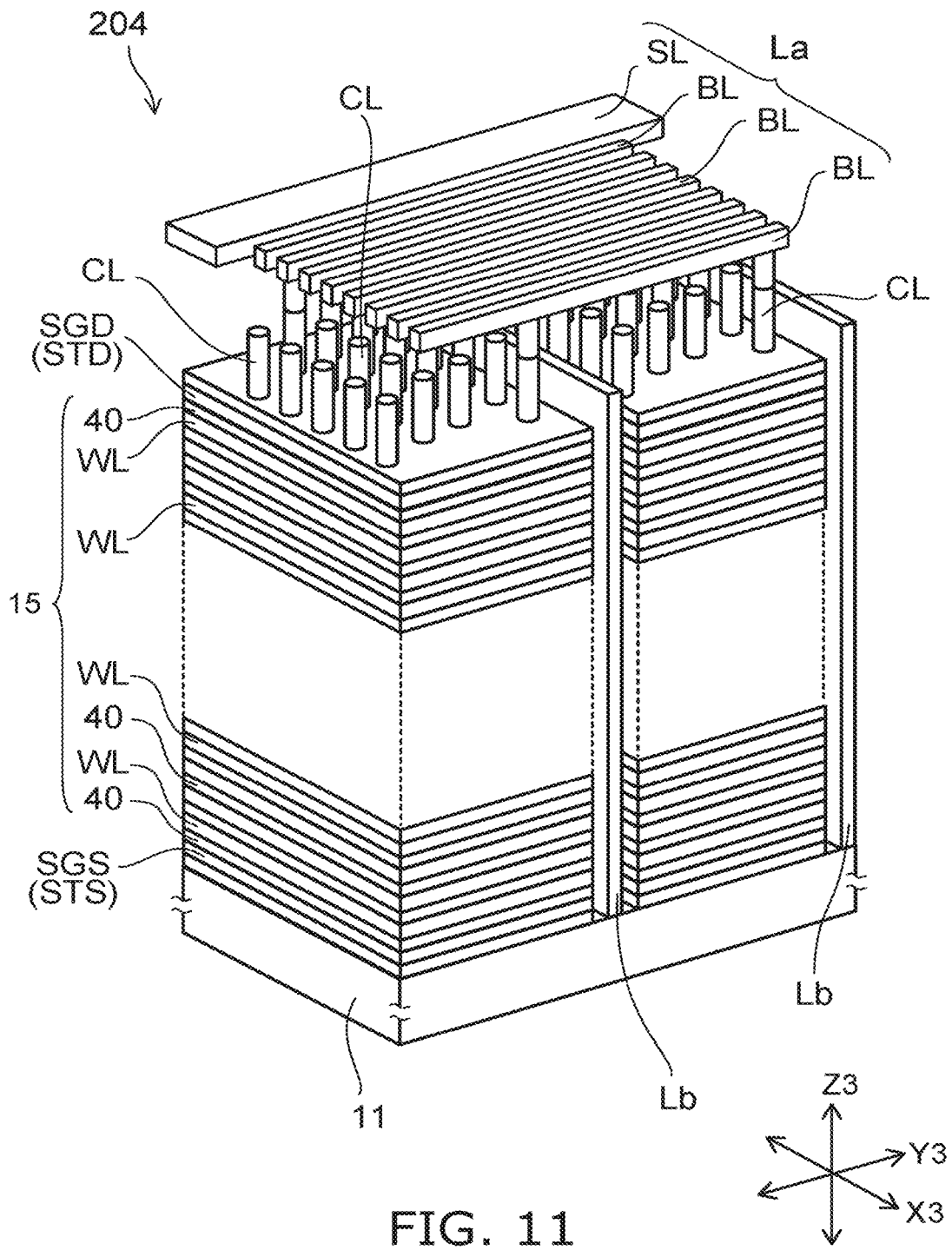
FIG. 11 is a schematic perspective view illustrating a memory device based on the insulating film according to the embodiment.

FIG. 11 is a schematic perspective view illustrating a memory device based on the insulating film according to the embodiment.

The memory device 204 shown in FIG. 11 is e.g. a nonvolatile three-dimensional memory array.

In FIG. 11, insulating layers between the electrode layers, for instance, are not shown for clarity of illustration.

As shown in FIG. 11, the memory device 204 of the embodiment includes a semiconductor layer 11 (substrate), a stacked body 15, an electrode film SGD, an electrode film SGS, a plurality of columnar parts CL, a first wiring layer La, and a second wiring layer Lb. The first wiring layer La is e.g. an upper wiring layer. In FIG. 11, the first wiring layer La includes a bit line BL and a source layer SL.

The direction perpendicular to the major surface of the semiconductor layer 11 (substrate) is referred to as Z3-direction. A direction perpendicular to the Z3-direction is referred to as X3-direction. The direction perpendicular to the X3-direction and perpendicular to the Z3-direction is referred to as Y3-direction.

The first wiring layer La is spaced from the semiconductor layer 11 (substrate) in the Z3-direction.

The stacked body 15 is provided between the first wiring layer La and the semiconductor layer 11. The stacked body 15 includes a plurality of electrode layers WL and a plurality of insulating parts 40. The plurality of electrode layers WL are spaced from each other in the Z3-direction. A plurality of insulating parts 40 are placed between the plurality of electrode layers WL. The number of stacked electrode layers WL shown in the figure is an example. The number of stacked electrode layers WL is arbitrary.

The electrode layer WL includes metal. The electrode layer WL includes at least one of e.g. tungsten, molybdenum, titanium nitride, and tungsten nitride. The electrode layer WL may include silicon or metal silicide.

The electrode film SGD is provided between the first wiring layer La and the stacked body 15. The electrode film SGD is e.g. the gate electrode of a drain side select transistor STD. The electrode film SGS is provided between the semiconductor layer 11 and the stacked body 15. The electrode film SGS is e.g. the gate electrode of a source side select transistor STS. The electrode film SGS and the electrode film SGD are made of e.g. the same material as the electrode layer WL.

The columnar part CL is provided between the semiconductor layer 11 and the first wiring layer La. The columnar part CL extends in the Z3-direction. The columnar part CL includes therein a semiconductor film 20 (see FIGS. 2A to 2F) extending in the Z3-direction. One end of the columnar part CL (semiconductor film 20) is electrically connected to the semiconductor layer 11. The other end of the columnar part CL (semiconductor film 20) is electrically connected to the bit wiring BL of the first wiring layer La.

The plurality of columnar parts CL are arranged on the X3-Y3 plane. At least part of each columnar part CL is placed in the stacked body 15. In other words, the stacked body 15 is juxtaposed with each columnar part CL in the X3-Y3 plane and surrounds the periphery of each columnar part CL. The electrode film SGS and the electrode film SGD are also juxtaposed with each columnar part CL in the X3-Y3 plane and surround the periphery of each columnar part CL.

The second wiring layer Lb is provided between the first wiring layer La and the semiconductor layer 11. The second wiring layer Lb has a shape extending in the X3-direction and the Z3-direction. In the example of FIG. 11, a plurality of second wiring layers Lb are juxtaposed with the stacked body 15 in the Y-axis direction. Each second wiring layer Lb is interposed between the stacked bodies 15.

One end (lower end) of the second wiring layer Lb is electrically connected to the semiconductor layer 11. The second wiring layer Lb is spaced from the columnar part CL. The second wiring layer Lb is electrically connected to the columnar part CL (the semiconductor film 20 in the columnar part CL) through the semiconductor layer 11. The other end (upper end) of the second wiring layer Lb is electrically connected to the source layer SL through a contact part, not shown.

The first wiring layer La includes a plurality of bit lines BL (e.g., metal films). The plurality of bit lines BL are spaced from each other in the X3-direction. Each bit line BL extends in the Y3-direction.

In the columnar part CL (semiconductor film 20), a current can be passed in the Z3-direction. One electrode layer WL and one columnar part CL function as one memory cell MC (see FIGS. 2A to 2F). The electrode layer WL functions as a control gate in the memory cell MC. That is, a plurality of memory cells MC with each electrode layer WL serving as a control gate are placed between the drain side select transistor STD and the source side select transistor STS.

The plurality of memory cells MC, the drain side select transistor STD, and the source side select transistor STS are connected in series through the semiconductor film 20 of the columnar part CL to constitute one memory string. A plurality of memory strings are arranged in the X3-Y3 plane. Thus, a plurality of memory cells MC are three-dimensionally arranged in the X3-direction, the Y3-direction, and the Z3-direction.

Figure 12:
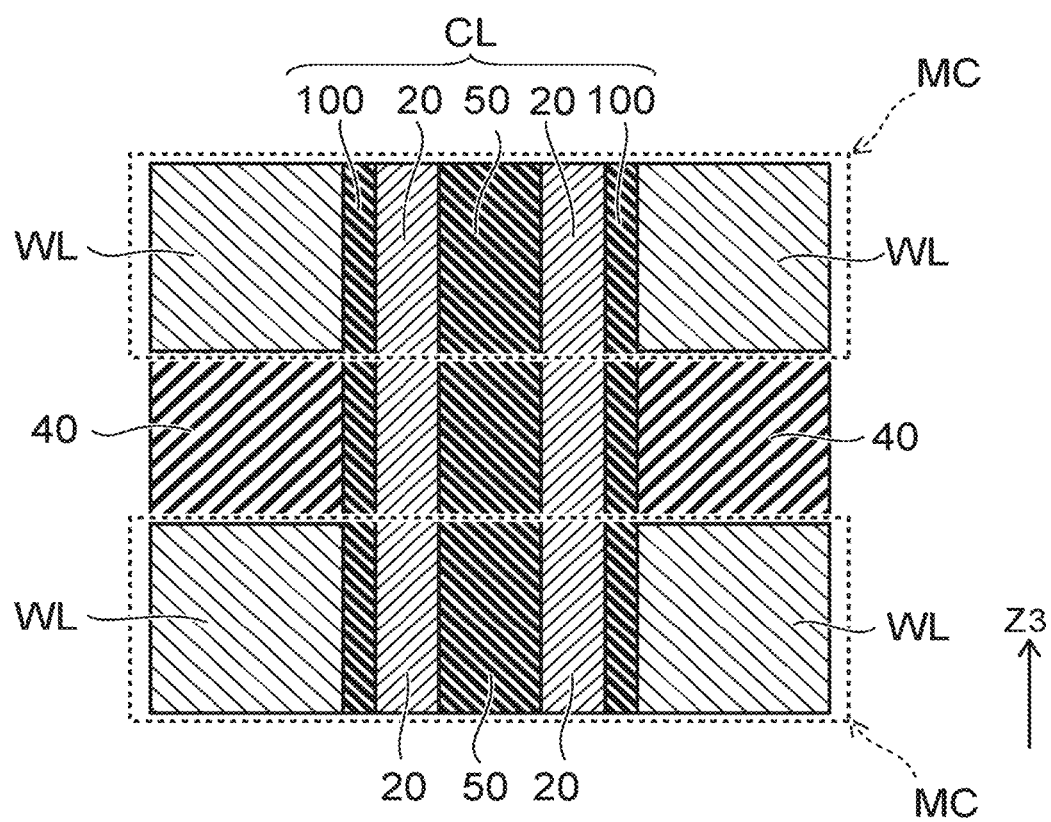
FIG. 12 is a schematic sectional view illustrating a memory device based on the insulating film according to the embodiment.

FIG. 12 is a schematic sectional view illustrating a memory device based on the insulating film according to the embodiment.

In FIG. 12, part of a cross section of the columnar part CL and the electrode layer WL is illustrated in enlarged view.

The columnar part CL includes a core insulating layer 50, a semiconductor film 20, and an insulating film 100. The insulating film 100 is similar to the insulating film 100 described with reference to e.g. FIG. 1. The semiconductor film 20 is e.g. a film composed primarily of silicon. The core insulating layer 50 includes e.g. silicon oxide. The core insulating layer 50 does not need to be provided.

The insulating film 100 is provided between the semiconductor film 20 and the electrode layer WL. The semiconductor film 20, the insulating film 100, and the electrode layer WL form a memory cell MC. Another film (such as insulating film) may be further provided between the electrode layer WL and the insulating film 100 or between the insulating film 100 and the semiconductor film 20.

The memory cell MC has e.g. a vertical transistor structure including the electrode layer WL as a control gate and the semiconductor film 20 as a channel. The insulating film 100 functions as a data storage layer. That is, writing can be performed on the memory cell MC by changing the polarization direction of the insulating film 100. The current flowing in the channel (semiconductor film 20) is changed depending on the change of the polarization direction. The written information can be read by detecting this current.

The embodiment can provide an insulating film (insulator) having large polarization and a memory device.

In this specification, the term "electrically connected" includes not only the case of being connected by direct contact, but also the case of being connected through e.g. another conductive member.

Hereinabove, embodiments of the invention are described with reference to specific examples. However, the invention is not limited to these specific examples. For example, one skilled in the art may similarly practice the invention by appropriately selecting specific configurations of components such as the insulating film, the insulating layer, the conductive layer, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all insulating films and all memory devices practicable by an appropriate design modification by one skilled in the art based on the insulating films and the memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An insulator comprising:
a material including barium and hafnium oxide,
the material having a crystal structure of a space group $Pbc2_1$.

2. The insulator according to claim 1, wherein a concentration of the barium in the material is not less than 1 at. % and not more than 9 at. %.

3. The insulator according to claim 1, wherein energy spectrum in the material by an X-ray photoelectron spectroscopy includes:
a first peak located at not less than 17.7 eV and not more than 18.5 eV;
a second peak located at not less than 16.3 eV and not more than 16.8 eV;
a third peak located at not less than 794.8 eV and not more than 795.3 eV; and
a fourth peak located at not less than 779.6 eV and not more than 780.1 eV.

4. A memory device comprising:
a first conductive layer;
a second conductive layer; and
a first insulating layer provided between the first conductive layer and the second conductive layer and including a material including barium and hafnium oxide,
the material having a crystal structure of a space group $Pbc2_1$.

5. The device according to claim 4, further comprising:
a second insulating layer provided between the first conductive layer and the first insulating layer.

6. The device according to claim 5, wherein
the second insulating layer includes silicon oxide, and
thickness of the second insulating layer along a direction from the first conductive layer toward the second conductive layer is not less than 0.1 nanometers and not more than 2.0 nanometers.

7. The device according to claim 4, wherein thickness of the first insulating layer is not less than 3 nanometers and not more than 30 nanometers.

8. The device according to claim 7, wherein the thickness of the first insulating layer is not more than 16 nanometers.

9. The device according to claim 4, wherein the first conductive layer includes at least one of TiN, TaN, TW, HfN, ZrN, TaAlN, WAlN, HfAlN, ZrAlN, and polysilicon.

10. The device according to claim 4, wherein a concentration of the barium in the material is not less than 1 at. % and not more than 9 at. %.

11. The device according to claim 4, wherein Young's modulus of a material of at least one of the first conductive layer and the second conductive layer is not less than 230 gigapascals and not more than 600 gigapascals.

12. The device according to claim 4, wherein the material has a composition of $Hf_{1-x}Ba_xO_{2-\delta}$, and $\delta$ is not less than 0.01 and less than 0.13.

13. A memory device comprising:
a first conductive layer;
a semiconductor layer; and
a first insulating layer provided between the first conductive layer and the semiconductor layer and including a material including barium and hafnium oxide,
the material having a crystal structure of a space group $Pbc2_1$.

14. The device according to claim 13, wherein the first conductive layer includes at least one of TiN, TaN, TW, HfN, ZrN, TaAlN, WAlN, HfAlN, ZrAlN, and polysilicon.

15. The device according to claim 13, wherein
the semiconductor layer includes:
a first region of a first conductivity type;
a second region of the first conductivity type separated from the first region in a first direction; and
a third region of a second conductivity type provided between the first region and the second region,
the first conductive layer is separated from the semiconductor layer in a second direction intersecting the first direction.

16. The device according to claim 13, wherein thickness of the first insulating layer is not less than 3 nanometers and not more than 30 nanometers.

17. The device according to claim 16, wherein the thickness of the first insulating layer is not more than 16 nanometers.

18. The device according to claim 13, wherein a concentration of the barium in the material is not less than 1 at. % and not more than 9 at. %.

19. The device according to claim 13, wherein Young's modulus of a material of at least one of the semiconductor layer and the first conductive layer is not less than 230 gigapascals and not more than 600 gigapascals.

20. The device according to claim 13, wherein the material has a composition of $Hf_{1-x}Ba_xO_{2-\delta}$, and $\delta$ is not less than 0.01 and less than 0.13.

* * * * *